United States Patent [19]

Sugou et al.

[11] Patent Number: 4,815,083
[45] Date of Patent: Mar. 21, 1989

[54] BURIED HETEROSTRUCTURE SEMICONDUCTOR LASER WITH HIGH-RESISTIVITY SEMICONDUCTOR LAYER FOR CURRENT CONFINEMENT

[75] Inventors: Shigeo Sugou; Tomoo Yanase, both of Tokyo, Japan

[73] Assignee: NEC Corporation, Tokyo, Japan

[21] Appl. No.: 878,745

[22] Filed: Jun. 26, 1986

[30] Foreign Application Priority Data

Jun. 27, 1985 [JP] Japan .................................. 60-140967
Jun. 28, 1985 [JP] Japan .................................. 60-141729

[51] Int. Cl.$^4$ .............................................. H02S 3/19
[52] U.S. Cl. ........................................ 372/46; 357/17
[58] Field of Search ............... 372/44, 45, 46; 357/16, 357/17, 61

[56] References Cited

U.S. PATENT DOCUMENTS 4,660,208 4/1987 Johnston, Jr. et al. ................ 372/46

OTHER PUBLICATIONS

"Journal of Lightwave Technology", vol. LT-1, No. 1, Mar. 1983, pp. 195-202, InGaAsP Double-Channel-Planar-Buried-Heterostructure Laser Diod (DC-PB-H-LD) with Effective Current Confinement.
"Electronics Letters", vol. 20, Oct. 11, 1984, pp. 856-857, Low-Threshold High-Speed 1-55 um Vapour Phase Transported Buried Heterostructure Lasers (VPTBH).

*Primary Examiner*—James W. Davie
*Attorney, Agent, or Firm*—Sughrue, Mion, Zinn, Macpeak & Seas

[57] ABSTRACT

An improved buried heterostructure semiconductor laser comprises high resistive burying layers positioned at both sides of an active region so that the high speed modulation is possible to be performed and the higher quantum efficiency is obtained for the reason why the capacitance and leakage current are diminished. A further improved buried heterostructure semiconductor laser comprises spacer layers between an active region and respective high resistive burying layers so that the reliability is maintained to be high for the reason why the diffusion of an impurity is avoided from the respective high resistive burying layers to the active region. Further, an improved process for the fabrication of a buried heterostructure semiconductor laser comprises steps of a buried heterostructure semiconductor laser comprises steps of forming mesa stripe including an active region on the upper portion of a double heterostructure and forming high resistive burying layers to be positioned at both sides of the active region.

5 Claims, 3 Drawing Sheets

BURIED HETEROSTRUCTURE SEMICONDUCTOR LASER WITH HIGH-RESISTIVITY SEMICONDUCTOR LAYER FOR CURRENT CONFINEMENT

FIELD OF THE INVENTION

The invention relates to a buried heterostructure semiconductor laser and a process for the fabrication of the same, and more particularly to a buried heterostructure semiconductor laser in which high resistive current blocking layers are positioned at both sides of an active region to allow the high speed modulation and to increase the quantum efficiency and reliability thereof and a process for the fabrication of the same.

BACKGROUND OF THE INVENTION

One of conventional semiconductor lasers has been described in detail on pages 195 to 202 of "JOURNAL OF LIGHTWAVE TECHNOLOGY, VOL. LT-1, No. 1, MARCH 1983". The semiconductor laser is of a type of Double Channel Planer Buried Heterostructure Laser Diode as simply called "DC-PBH-LD" which is fabricated, for instance by a two-step iiquid phase epitaxy growth process. That is to say, a double heterostructure wafer is grown to have an n-InP buffer layer, an InGaAsP active layer, and a p-InP cladding layer on a <001>n-InP substrate in the first step thereby forming mesa stripe of about 2 μm-width in the <110> direction in accordance with a pair of 7 μm-wide and 3 μm-deep channels by using Br-methanol solution and photoresist mask. In the second step, a p-InP current blocking layer and an n-InP current confining layer are grown exclusively on the channels and the remaining flat parts excluding the top of the mesa, and a p-InP embedding layer and a p-InGaAsP cap layer are successively grown thereon to provide a substantially flat surfaced DC-PBH-LD.

As a result, there is fabricated a semiconductor laser which comprises buried layers having pnpn junction structures positioned at both sides of a double heterostructure including an active region.

In operation of the semiconductor laser, np reverse junctions of the pnpn junction structures prevent current from flowing thereby resulting in selective current injection into the active region.

In a current blocking structure including such an np reverse-junction, the current blocking can be effectively made so that the quantum efficiency of more than 50% is obtained.

According to the conventional semiconductor laser, however, the np reverse-junction presents the capacitance in its value exceeding 10 pF so that the high speed modulation is difficult to be performed at a rate of more than 4Gb/s for the reason why the time constant thereof becomes larger.

There has been fabricated another conventional buried heterostructure semiconductor laser as described on pages 856 to 857 of "ELECTRONICS LETTERS, VOL. 20, OCT. 11, 1984" in which an active region is buried at both sides thereof by intrinsic semiconductors (called "i-layer" hereinafter).

In operation of the semiconductor laser, the high speed modulation can be performed at a rate of more than 4Gb/s for the reason why a pn junction which suppresses the high speed modulation is only provided in the active region. On the other hand, it is designed to reduce the leakage current flowing outside the active region in accordance with the high resistance of the i-layer.

According to the second conventional semiconductor laser, however, the quantum efficiency is not highly obtained due to the fact that the resistance of the i-layer does not practically become so large as expected. In more detail, there is a limitation that the concentration of an impurity does not become lower than about $1.10^{14} cm^{-3}$ in regard to background impurity level for physical reasons in a case where the i-layer is formed in a practical epitaxial growth. In such a case, the resistivity of the InP i-layer is about 10 106 -cm so that it is difficult to provide a sufficient current blocking effect.

There has been fabricated still another conventional buried heterostructure semiconductor laser in which an active region is buried at both sides thereof by insulating layers as described in detail on pages 78 to 100 of "APPLIED PHYSICS LETTERS, VOL. 47, JULY 15, 1985", which was published after the Convention date of the instant application.

In operation of the semiconductor laser, the high speed modulation can be performed at a rate of more than 4Gb/s for the same reason as the second conventional semiconductor laser. At the same time, the current blocking is effectively achieved due to the high resistance of the insulating layers.

According to the third conventional semiconductor laser, however, the reliability thereof is not highly obtained for the reason why the active region is in contact at both sides thereof with the insulating layers so that defects tend to occur in the active region.

As described above, the high speed modulation, quantum efficiency, and reliability are difficult to be achieved as expected in the respective conventional buried heterostructure semiconductor lasers.

SUMMARY OF THE INVENTION

Accordingly, it is an object of the invention to provide a buried heterostructure semiconductor laser in which high speed modulation is performed at a rate of more than 4Gb/s by preventing the time constant from becoming larger and to provide a process for the fabrication of the same.

It is a further object of the invention to provide a buried heterostructure semiconductor laser in which the higher quantum efficiency is obtained by reducing the leakage current flowing outside an active region and to provide a process for the fabrication of the same.

It is a still further object of the invention to provide a buried heterostructure semiconductor laser in which the reliability is improved by preventing defects from occuring in an active region and a process for the fabrication of the same.

According to the invention, there is provided a buried heterostructure semiconductor laser composed of compound semiconductor material and comprising a double heterostructure including an active region and semiconductor layers positioned on both surfaces of said active region, each of said semiconductor layers having the forbidden band width which is different from that of said active region, and burying layers positioned at both sides of said double heterostructure, each of said burying layers having the refractive index lower than that of said active region and having the forbidden band width larger than that of said active region, wherein each of said burying layers comprises a high resistive semiconductor layer including at least one impurity which occupies deep level therein.

In another aspect of the buried heterostructure semiconductor laser according to the invention, each of the burying layers comprises the high resistive layer including at least one impurity which occupies deep level therein and a spacer layer including no impurity positioned between the active region and the high resistive layer.

In still another aspect of the buried heterostructure semiconductor laser according to the invention, the impurity which occupies deep level in the burying layers is of one or more selected from Fe, Cr, V, Mn, Co.

According to the invention, there is further provided a process for the fabrication of a buried heterostructure semiconductor laser comprising steps of forming a double heterostructure comprising an active region and semiconductor layers positioned on both surfaces of said active region, the forbidden band width of said semiconductor layers being different from that of said active region, forming mesa stripe including said active region in a predetermined direction on the upper portion of said double heterostructure, and forming burying layers to be positioned at both sides of at least said active region, wherein said step of forming said burying layers comprises first step of forming spacer layers along the side surfaces of said active region, each of said spacer layers being composed of a semiconductor layer having no impurity which occupies deep level, and second step of forming high resistive layers each composed of a semiconductor layer having at least one impurity which occupies deep level therein.

The invention will be summarized before describing preferred embodiments thereof as follows.

The inventors fabricated a buried heterostructure semiconductor laser comprising burying layers each of which is composed of a high resistive semiconductor doped by an impurity, for instance, Fe which occupies deep level therein on an experimental basis.

In the semiconductor laser, the leakage current was effectively decreased in accordance with the presence of the high resistive semiconductor layers. The high speed modulation was also performed for the reason why the capacitance was extraordinarily decreased therein. Further, the reliability was increased as compared to the third conventional semiconductor laser because an active region was surrounded by semiconductors.

However, the reliability thereof was not so high as expected in the experimental results. The inventors have decided in their research that the cause by which the improvement of the reliability was suppressed was that Fe was diffused from the high resistive layers to the active region thereby deteriorating the active region and forming non-luminescence recombination center due to the fact that the active region was directly in contact at both sides thereof with the high resistive layers including Fe.

In order to overcome the disadvantage mentioned above, undoped space layers were positioned between the active region and the respective high resistive burying layers. As a result, the problem in which the improvement of the reliability was suppressed was resolved.

In regard to the high speed modulation mentioned before, only the active region of the mesa stripe included a pn junction so that the parasitic capacitance was very small due to the limited presence of the pn junction. Therefor, the high speed modulation was effectively performed.

Further, the resistivity of the high resistive burying layers was increased to be about $10^5 \Omega$-cm, $10^4$ times as compared to that of the conventional i-layer by use of at least one impurity selected from, for instance, Fe, Cr, V, Mn, or Co which occupied deep level in the high resistive layers.

As a result, the leakage current was extremely decreased so that the quantum efficiency was highly improved.

BRIEF DESCRIPTION OF THE DRAWINGS

The invention will be explained in more detail in accordance with following drawings wherein.

DESCRIPTION OF THE PREFERRED EMBODIMENT

Figure 1:
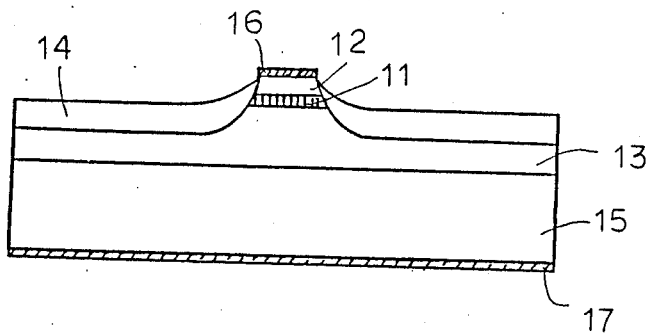
FIG. 1 is a cross sectional view illustrating the first embodiment of a buried heterostructure semiconductor laser according to the invention.

In FIG. 1, there is shown the first embodiment of a buried heterostructure semiconductor laser according to the invention which comprises an active region 11 of undoped InGaAsP, a p-cladding layer 12 of Zn doped InP by $1 \times 10^{18} cm^{-3}$, an n-buffer layer 13 of S doped InP by $1 \times 10^{18} cm^{-3}$, high resistive current blocking layers 14 each of which is of Fe doped InP by $1 \times 10^{18} cm^{-3}$, a semiconductor substrate 15 of S doped InP, a p-contact 16 provided on the upper surface of the p-cladding layer 12, and an n-contact 17 provided on the lower surface of the semiconductor substrate 15.

In operation of the semiconductor laser, the flow of current converges into the active region 11 because the resistivity of the high resistive current blocking layers 14 is as high as about $10^5 \Omega cm$. In this case, the composition of the active region 11 is selected such that an oscillation wavelength is 1.3 μm.

In the construction of the semiconductor laser, a pn junction is only formed across about 1 μm-wide region where the active region 11 is interposed between the p-cladding layer 12 and the n-buffer layer 13 so that the capacitance becomes as low as 1 pF which is one tenth as compared to that of a conventional DC-PBH-LD which has current blocking layers each including a pn junction. As a result, the high speed modulation is effectively performed at a rate of more than 4Gb/s for the reason why the time constant becomes very small. Further, the leakage current is substantially negligible for the existence of the high resistive current blocking layers 14 so that the quantum efficiency is as high as more than 50%.

In fabricating a semiconductor laser mentioned above, 1 μm-wide mesa stripe is formed to provide an active region by the chemical etching of a double heterostructure crystal prepared in an ordinal manner as shown in FIG. 1. Next, high resistive current blocking layers each of which is of Fe doped InP is formed by the hydride vapor phase epitaxy. At this stage, InCl gas obtained from the reaction of In metal and HCl gas is used as a raw material of In while $PH_3$ gas and $Fe(C_2H_5)_2$ are respectively used as raw materials of P and Fe. The above mentioned chemical etching is performed at a room temperature for 30 seconds by use of 0.4%Br - $CH_3OH$ (Bromine Methanol).

Figure 2:
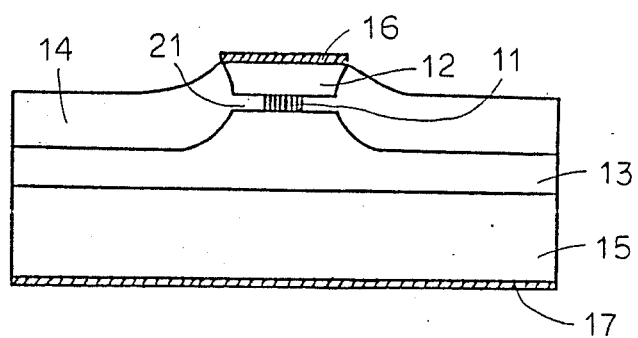
FIG. 2 is a cross sectional view illustrating the second embodiment of a buried heterostructure semiconductor laser according to the invention.

In FIG. 2, there is shown the second embodiment of a buried heterostructure semiconductor laser according to the invention in which the construction thereof is almost the same as that in the first embodiment mentioned above except that the undoped InGaAsP active region 11 is constricted to be narrowed in regard to the transverse width thereof thereby providing constricted portions 21 at both sides thereof.

In fabricating a semiconductor laser of the second embodiment of the invention, an active region 11 of undoped InGaAsP is selectively etched to provide constricted portions 21 at both sides thereof. Next, the active region 11 having the constricted portions 21 thus formed is buried by Fe doped InP layers 14 through the hydride vapor phase epitaxy in the same manner as in the first embodiment such that high resistive current blocking layers 14 are respectively formed into the constricted portions 21. At the stage of forming the constricted portions 21, the first chemical etching is performed at a room temperature for 30 seconds by use of 0.4% Br-$CH_3OH$ to provide a mesa including the active region 11, and the second chemical etching is performed at a room temperature for 10 seconds by use of the mixture solution of sulfuric acid, hydrogen peroxide, and water($H_2O$) in which the mixing ratio is 3:1:1 to provide the constricted portions 21 at both sides of the active region 11.

In the semiconductor laser thus fabricated, mesa can be made wider (for instance, 2 μm) than that in the first embodiment so that a p-contact 12 becomes easier to be formed thereon. Further, a pn junction is only formed across about 1 μm-wide region where the active region 11 is interposed between a p-cladding layer 12 and an n-buffer layer 13 while the high resistive current blocking layers 14 are positioned at both sides of the active region 11 so that the high speed modulation can be peformed and the oscillation efficiency is highly obtained.

Figure 3:
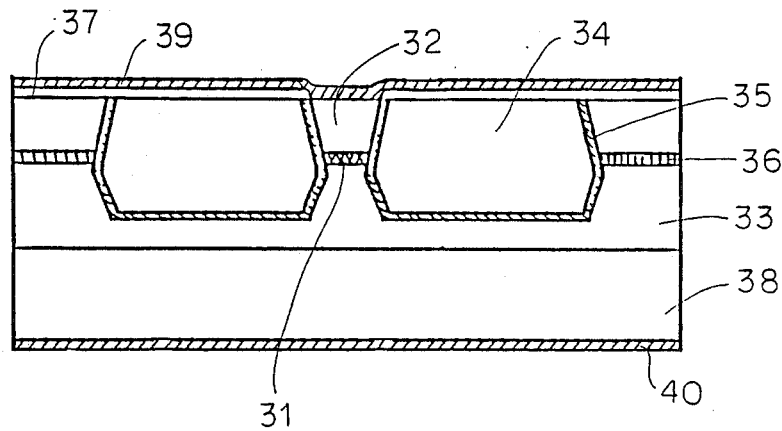
FIG. 3 is a cross sectional view illustrating the third embodiment of a buried heterostructure semiconductor laser according to the invention.

In FIG. 3, there is shown the third embodiment of a buried heterostructure semiconductor laser according to the invention which comprises an active region 31 of undoped InGaAsP, a p-cladding layer 32 of Zn doped InP by $1\times10^{18}cm^3$, an n-buffer layer 33 of S doped InP by $1\times10^{18}cm^{-3}$, high resistive current blocking layers 34 each being of Fe doped InP layer by $1\times10^{16}cm^{-3}$, undoped spacer layers 35 each of which is formed along a corresponding side face of a double heterostructure including the active region 31, the p-cladding layer 32, and the n-buffer layer 33 in part, a four element layer 36 of undoped InGaAsP, a $SiO_2$ layer 37, a semiconductor substrate 38 of S doped InP, a p-contact 39 which is in contact through an opening of the $SiO_2$ layer 37 with the p-cladding layer 32, and a n-contact 40 which is in contact with the semiconductor substrate 38.

In fabricating a semiconductor laser mentioned above, an active region 31 of undoped InGaAsP is provided in the chemical etching of a double heterostructure. The chemical etching is performed at a room temperature for 10 seconds by use of the mixture solution of hydrochloric acid and nitric acid in which the mixing ratio thereof is 1:2.

In the construction of the semiconductor laser, the active region is of 1.5 μm in the transverse width thereof, and each of the spacer layers 35 is of 0.1 μm in the thickness thereof.

In operation of the semiconductor laser, the flow of current converges into the active region 11 since the high resistive current blocking layers 34 and the $SiO_2$ layer 37 block the current therethrough. Further, a pn junction is only formed across the 1.5 μm-wide active region 31 so that the parasitic capacitance is as low as about 1pF which is one tenth as compared to a conventional DC-PBH-LD. Therefore, the high speed modulation can be performed at a rate of more than 4Gb/s. At the same time, the thickness of the undoped spacer layer 35 is very thin so that the leakage current which flows therethrough outside the active region 31 is very small. Therefore, the quantum efficiency is obtained with more than 50%. Still further, it is effectively avoided by the undoped spacer layers 35 that the active region 31 is contaminated by an impurity of Fe in the high resistive current blocking layers 34 so that the active region 31 is prevented from being deteriorated to provide a higher reliability. It is considered that this is achieved for the reason why the undoped spacer layers 35 prevent the impurity of Fe from diffusing respectively from the high resistive current blocking layers 34 to the active region 31 although the impurity of Fe to be contained in the active region will act as non-luminescence recombination center for injection carrier if the impurity of Fe diffuses from the high resistive current blocking layers 34 to the active region 31.

Figure 4:
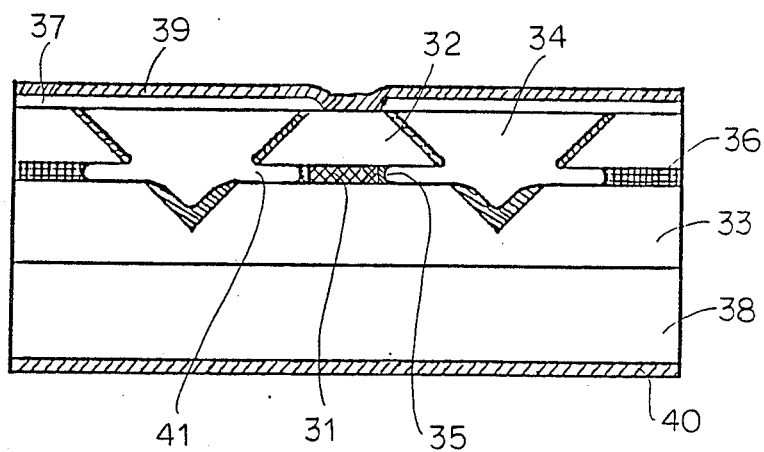
FIG. 4 is a cross sectional view illustrating the fourth embodiment of a buried heterostructure semiconductor laser according to the invention.

In FIG. 4, there is shown the fourth embodiment of a buried heterostructure semiconductor laser according to the invention in which the construction thereof is almost the same as that in the third embodiment except that the undoped InGaAsP active region 31 is constricted to be narrowed in regard to the transverse width thereof thereby providing constricted portions 41 at both sides thereof.

In fabricating a semiconductor laser of the fourth embodiment of the invention, an active region 31 of undoped InGaAsp is selectively etched to provide constricted portions 41 at both sides thereof. Next, mesa having the constricted portions 21 thus formed is buried by undoped spacer layers 35 and then high resistive current blocking layers 34 in the same manner as in the third embodiment. As clearly understood from the illustration in FIG. 4, the fabrication of the semiconductor laser becomes easier because a forward mesa is formed. At the stage of forming the constricted portions 41, the first chemical etching is performed at a room temperature for 60 seconds by use of the mixture solution of HCl and $CH_3COOH$ in which the mixing ratio thereof is 1:1 to provide a mesa including the active region 31, and the second chemical etching is performed at a room temperature for 10 seconds by use of the mixture solution of sulfuric acid, hydrogen peroxide, and water($H_2O$) in which the mixing ratio is 3:1:1 to provide the constricted portions 41 at both sides of the active region 31.

In the construction of the semiconductor laser, the high speed modulation can be performed at a rate of more than 4Gb/s, the quantum efficiency is as high as 50%, and the reliability becomes higher for the same reason mentioned in the third embodiment.

In the first to fourth embodiments, Fe doped InP is used for high resistive current blocking layers. On the other hand, Cr doped InP, V doped InP, Mn doped InP, or Co doped InP may be used in place of Fe doped InP. As a matter of course, Cr and Fe doped InP or other two or three elements doped InP is also applicable for the same purpose.

Figure 5A:
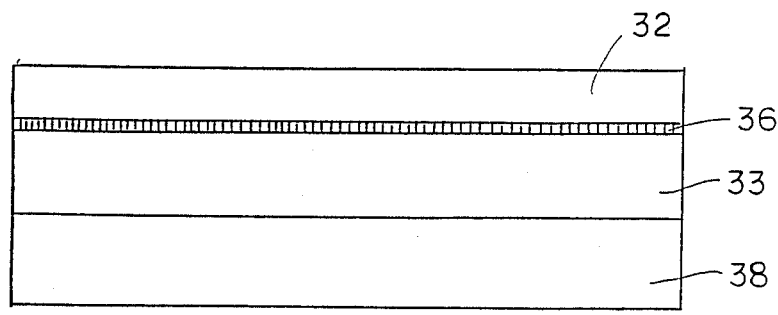
FIGS. 5A to 5C are cross sectional views illustrating an embodiment of a process for the fabrication of a buried heterostructure semiconductor laser according to the invention.
Figure 5B:
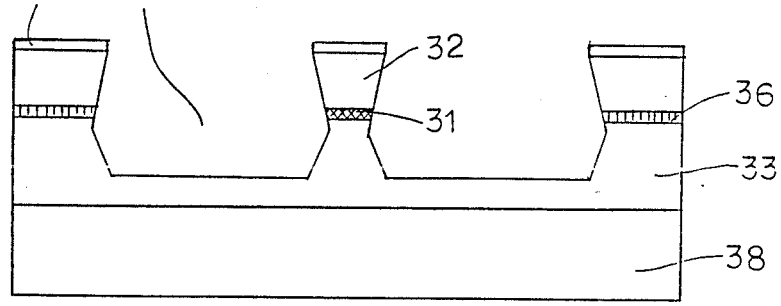
Figure 5C:
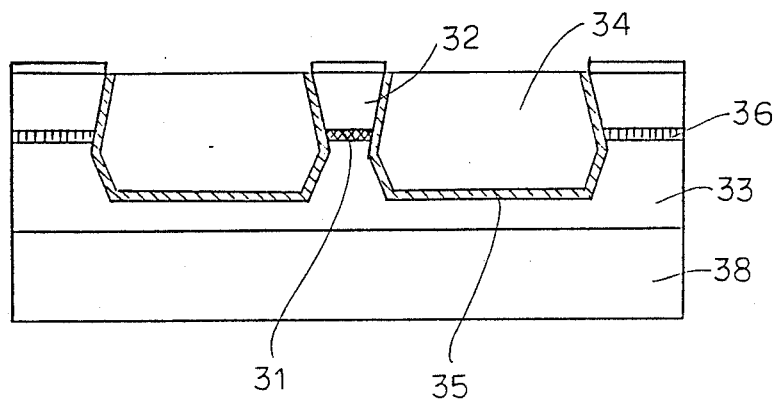

In FIGS. 5A to 5C, there is shown the first embodiment of a process for the fabrication of a double heterostructure semiconductor laser according to the invention.

In FIG. 5A, there is prepared a double heterostructure crystal which comprises a p-cladding layer 32 of Zn doped InP by $1 \times 10^{18} cm^{-3}$, a four element layer 36 of undoped InGaAsP, an n-buffer layer 33 of S doped InP by $1 \times 10^{18} cm^{-3}$, and a semiconductor substrate 38 of S doped InP.

In FIG. 5B, there are formed two parallel channels 50 by use of a predetermined pattern of $SiO_2$ mask 51 to provide 1.5 μm-wide mesa stripe including an active region 31 in the <011> direction. At this stage, the chemical etching is adopted by use of hidrochroride acid and nitric acid mixture solution. The mixing ratio of hydrochloric acid and nitric acid is 1:2, and the etching time and temperature are for 10 seconds and at a room temperature respectively.

In FIG. 5C, there are formed undoped spacer layers 35 on the surfaces of the channels 50, and successively formed high resistive current blocking layers 34 of Fe doped InP on the surfaces of the undoped spacer layers 35 by the hydride vapour phase epitaxy. In forming the undoped spacer layers 35 on the side surfaces of the mesa including the active region 31 by the epitaxial growth, the flowing amount of InCl gas, $PH_3$ gas and $H_2$ gas is controlled to be within 1 to 5 cc/min, 0.5 to 5 cc/min, and 1 to 3 l/min respectively. In forming the high resistive current blocking layers 34, a raw material for In is InCl gas obtained by the reaction of In metal and HCl gas at a high temperature, a raw material for P is $PH_3$ gas, and a raw material for Fe is $FeCl_2$ gas obtained by the reaction of Fe metal and CH1 at a high temperature. Further, the temperature of the substrate 38 is maintained to be constant at the range of 500° to 700° C. As a result, a double heterostructure semiconductor laser is fabricated as shown in FIG. 3.

There will be explained the second embodiment of a process for the fabrication of a double heterostructure semiconductor laser according to the invention.

In the second embodiment, mesa stripe including an active region is formed in the <011> direction and the active region is selectively etched to be narrowed in the transverse width thereof by use of sulfuric acid etching solution. In more detail, the first chemical etching is performed at a room temperature for 60 seconds by use of the mixture solution of HCl and $CH_3COOH$ in which the mixing ratio is 1:1 to provide a mesa including the active region, and the second chemical etching is performed at a room temperature for 10 seconds by use of the mixture solution of sulfuric acid, hydrogen peroxide, and water($H_2O$) in which the mixing ratio is 3:1:1 to provide the constricted portions at both sides of the active region. On the other hand, the same other steps are adopted as in the first embodiment of a process for the fabrication of a double heterostructure semiconductor laser. As a result, a double heterostructure semiconductor laser is fabricated as shown in FIG. 4.

Although the invention has been described with respect to specific embodiments for complete and clear disclosure, the appended claims are not to thus limited but are to be construed as embodying all modification and alternative constructions that may occur to one skilled in the art which fairly fall within the basic teaching herein set forth.

For instance, (1) Although a composition of InGaAsP in which the oscillation is obtained at the wavelength of 1.3 μm is used in an active region, the composition is not limited to be used for InGaAsP.

(2) Although InP is used repectively for undoped space layers and high resistive current blocking layers, InGaAsP may be used.

(3) Although InGaAsP/InP semiconductor material is used, such a material as III–V group semiconductor material of GaAlAs/GaAs, InGaAlAs/InP etc. may be used.

(4) Although hydride vapor phase epitaxy is adopted, such epitaxial growth as liquid phase epitaxy may be adopted.

We claim:

1. A buried heterostructure semiconductor laser composed of compound semiconductor material comprising:

a double heterostructure including an active region and semiconductor layers positioned on both surfaces of said active region, each of said semiconductor layers having a forbidden band width which is different from that of said active region;

and burying layers positioned at both sides of said double heterostructure, each of said burying layers having a refractive index lower than that of said active region;

electrode means for applying current to said active region;

means for providing optical feedback of a stimulated emission from said active region; and wherein each of said burying layers comprises a high resistivity hydride vapor-phase-epitaxy-grown semiconductor layer having a resistivity sufficient to constrain said current to flow through said active region.

2. A buried heterostructure semiconductor laser according to claim 1, wherein each of said burying layers further comprises a spacer layer positioned between said active region and said high resistive layer.

3. A buried heterostructure semiconductor laser according to claim 1 or 2, wherein said active region is narrowed to have constricted portions at both sides thereof.

4. A buried heterostructure semiconductor laser according to claim 1 or 2, wherein said high resistivity hydride vapor-phase-epitaxy-grown semiconductor layer includes impurity atoms selected from the group consisting of Fe, Cr, V, Mn, and Co.

5. A buried heterostructure semiconductor laser composed of compound semiconductor materials comprising:

a double heterostructure including an active region and semiconductor layers positioned on both surfaces of said active region, each of said semiconductor layers having a forbidden band width which is different from that of said active region;

burying layers positioned at both sides of said double heterostructure, each of said burying layers having a refractive index lower than that of said active region;

electrode means for applying current to said active region, and means for providing optical feedback of a stimulated emission of said active region;

wherein each of said burying layers comprises a high resistivity hydride vapor-phase-epitaxy-grown InP layer which includes impurity atoms selected from the group consisting of Fe, Cr, V, Mn, and Co.

* * * * *